United States Patent
Kuo

(10) Patent No.: US 8,274,304 B2
(45) Date of Patent: Sep. 25, 2012

(54) AC POWER SUPPLY MEASURING CIRCUIT WITH VOLTAGE PROTECTING FUNCTION

(75) Inventor: Heng-Chen Kuo, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 284 days.

(21) Appl. No.: 12/760,454

(22) Filed: Apr. 14, 2010

(65) Prior Publication Data

US 2011/0221467 A1    Sep. 15, 2011

(30) Foreign Application Priority Data

Mar. 12, 2010  (TW) .................. 99107397 A

(51) Int. Cl.
*G01R 31/40* (2006.01)
*G01R 31/02* (2006.01)
*G01R 11/32* (2006.01)
*G01R 19/00* (2006.01)

(52) U.S. Cl. ............. 324/764.01; 324/762.01; 324/142; 702/64

(58) Field of Classification Search .......... 324/115–116, 324/142, 762.01–763.01, 764.01; 702/57, 702/60, 64; 361/42–57, 90, 91.1, 91.2; 327/524
See application file for complete search history.

(56) References Cited

U.S. PATENT DOCUMENTS

| | | | |
|---|---|---|---|
| 7,209,868 B2 * | 4/2007 | Kuo ................................. 702/189 |
| 7,221,142 B2 * | 5/2007 | Murray et al. ............. 324/117 R |
| 7,414,820 B2 * | 8/2008 | Kuo ................................. 361/77 |
| 7,446,538 B2 * | 11/2008 | Kuo ................................. 324/508 |
| 7,446,539 B2 * | 11/2008 | Kuo ................................. 324/522 |
| 7,495,427 B2 * | 2/2009 | Kuo ................................. 323/369 |
| 7,528,734 B2 * | 5/2009 | Kuo ................................. 340/661 |
| 7,576,450 B2 * | 8/2009 | Kuo ................................. 307/115 |
| 7,709,975 B2 * | 5/2010 | Kuo ................................. 307/80 |
| 7,834,651 B2 * | 11/2010 | Obara ...................... 324/764.01 |
| 7,868,637 B2 * | 1/2011 | Avritch et al. ........... 324/762.07 |
| 7,888,960 B2 * | 2/2011 | Migliavacca ............. 324/764.01 |
| 7,923,983 B2 * | 4/2011 | Fornage ..................... 324/76.11 |
| 7,969,176 B2 * | 6/2011 | Xiong ....................... 324/764.01 |
| 8,098,468 B2 * | 1/2012 | Zhu et al. ..................... 361/91.1 |
| 2003/0137319 A1 * | 7/2003 | Furukawa ..................... 324/771 |
| 2004/0217653 A1 * | 11/2004 | Neidorff ......................... 307/80 |
| 2006/0071682 A1 * | 4/2006 | Hashimoto ................... 324/771 |
| 2009/0091958 A1 * | 4/2009 | Kao et al. ........................ 363/84 |

* cited by examiner

*Primary Examiner* — Joshua Benitez
(74) *Attorney, Agent, or Firm* — Altis Law Group, Inc.

(57) ABSTRACT

An alternating current (AC) power supply measuring circuit includes a voltage dividing circuit, a measuring integrated circuit (IC), a control board, and a first power rectifying circuit. The voltage dividing circuit receives an AC voltage signal and divides the AC voltage signal to a first voltage dividing signal and a second voltage dividing signal. The measuring IC receives the first and second voltage dividing signals to obtain an AC voltage measuring signal. The control board receives the AC voltage measuring signal and processes the AC voltage measuring signal. The first power rectifying circuit provides a floating ground signal to the voltage dividing circuit.

4 Claims, 2 Drawing Sheets

AC POWER SUPPLY MEASURING CIRCUIT WITH VOLTAGE PROTECTING FUNCTION

BACKGROUND

1. Technical Field

The present disclosure relates to measuring circuits, and particularly, to an alternating current (AC) power supply measuring circuit with voltage protecting function.

2. Description of Related Art

Conventional power supplies for electronic equipments employ three-wire AC configuration. Generally, a "hot pin" and a "neutral pin" provide electrical power, and a "ground pin" for shorting dangerous current to ground.

AC wall outlets are sometimes miswired. The hot wire may be connected to the neutral pin and the neutral wire connected to the hot pin or the neutral wire may be connected to the grounding pin and the grounding wire connected to the neutral pin or variations of these misconnections. These miswiring may present an electrocution or shock hazard or may damage equipment connected to the miswired electrical outlet.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
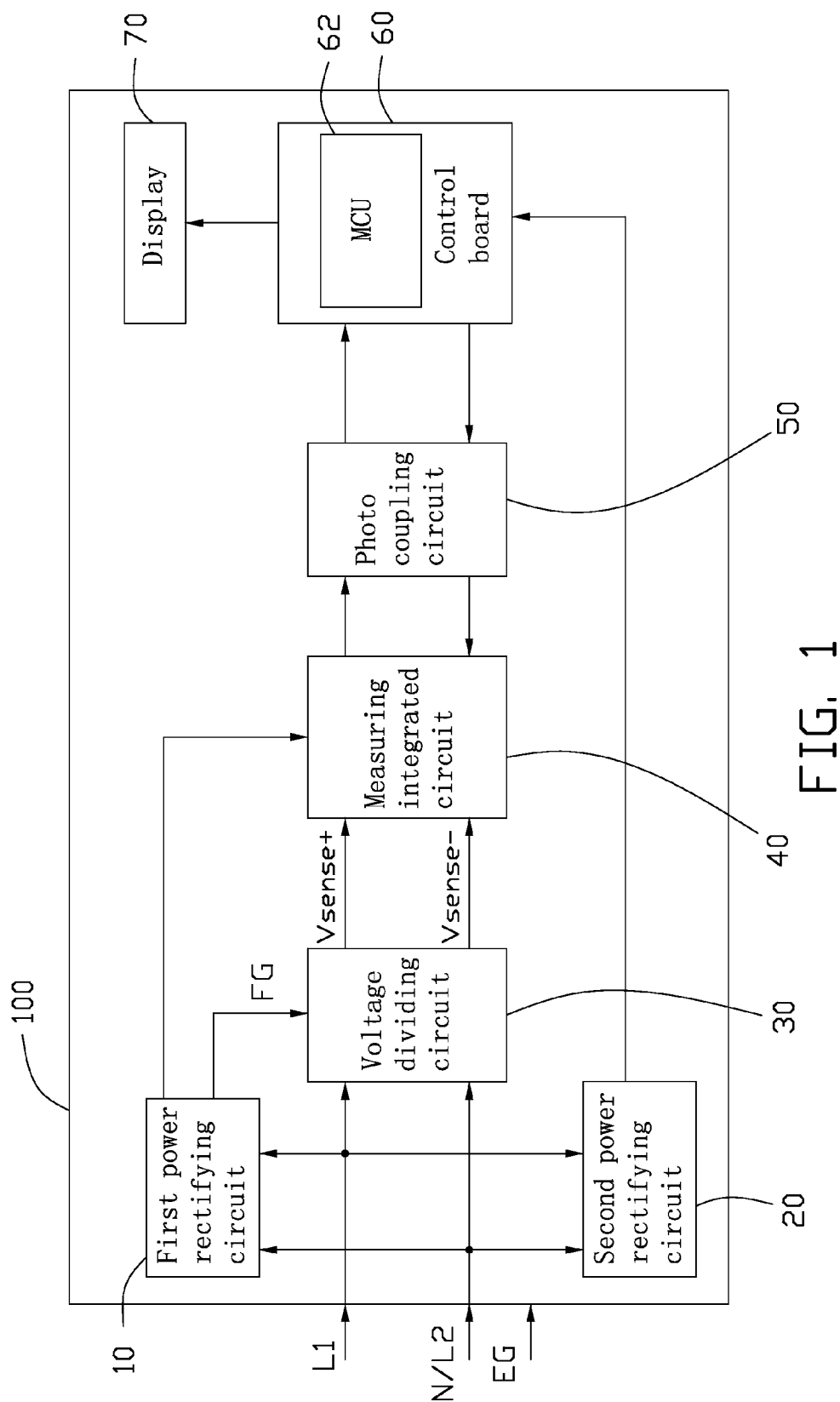
FIG. 1 is a block diagram of an embodiment of an alternating current (AC) power supply measuring circuit including a voltage dividing circuit.

Referring to FIG. 1, an embodiment of an alternating current (AC) power supply measuring circuit 100 includes a first power rectifying circuit 10, a second power rectifying circuit 20, a voltage dividing circuit 30, a measuring integrated circuit (IC) 40, a photo coupling circuit 50, a control board 60, and a display 70. The control board 60 includes a micro control unit (MCU) 62. For receiving an external AC power supply, the measuring circuit 100 further includes a first input terminal L1 and a second input terminal N/L2. For protecting users from getting an electric shock, an enclosure ground terminal EG is also provided, and electronically connects to a metal enclosure of the measuring circuit 100. The first input terminal L1, the second input terminal N/L2, and the enclosure ground terminal EG are typically assembled in an electrical plug (not shown).

When the electrical plug of the measuring circuit 100 is plugged into an AC wall outlet (not shown) which is a 110 volt (V) or a 220V single-phase two-wire-plus-ground (1Φ2W+G) system, the first input terminal L1 electrically connects to a hot pin of the electrical outlet, the second input terminal N/L2 electrically connects to a neutral pin of the electrical outlet, and the ground terminal EG electrically connects to a ground pin of the electrical outlet. When the electrical plug of the measuring circuit 100 is plugged into an AC wall outlet (not shown) which is a 220V single-phase three-wire electrical (1Φ3W) system, the first input terminal L1 electrically connects to a first hot pin of the electrical outlet, the second input terminal N/L2 electrically connects to a second hot pin of the electrical outlet, and the ground terminal EG electrically connects to a ground pin of the electrical outlet.

The first power rectifying circuit 10 connects to the first input terminal L1 and the second input terminal N/L2, to receive an AC voltage signal from the first input terminal L1 and the second input terminal N/L2, and rectify the AC voltage signal to a first direct current (DC) voltage signal to the measuring IC 40. Furthermore, the first power rectifying circuit 10 provides a floating ground signal FG, such as 0V voltage signal, to the voltage dividing circuit 30.

The second power rectifying circuit 20 connects to the first input terminal L1 and the second input terminal N/L2, to receive the AC voltage signal from the first input terminal L1 and the second input terminal N/L2, and rectify the AC voltage signal to a second direct current (DC) voltage signal to the control board 60.

Figure 2:
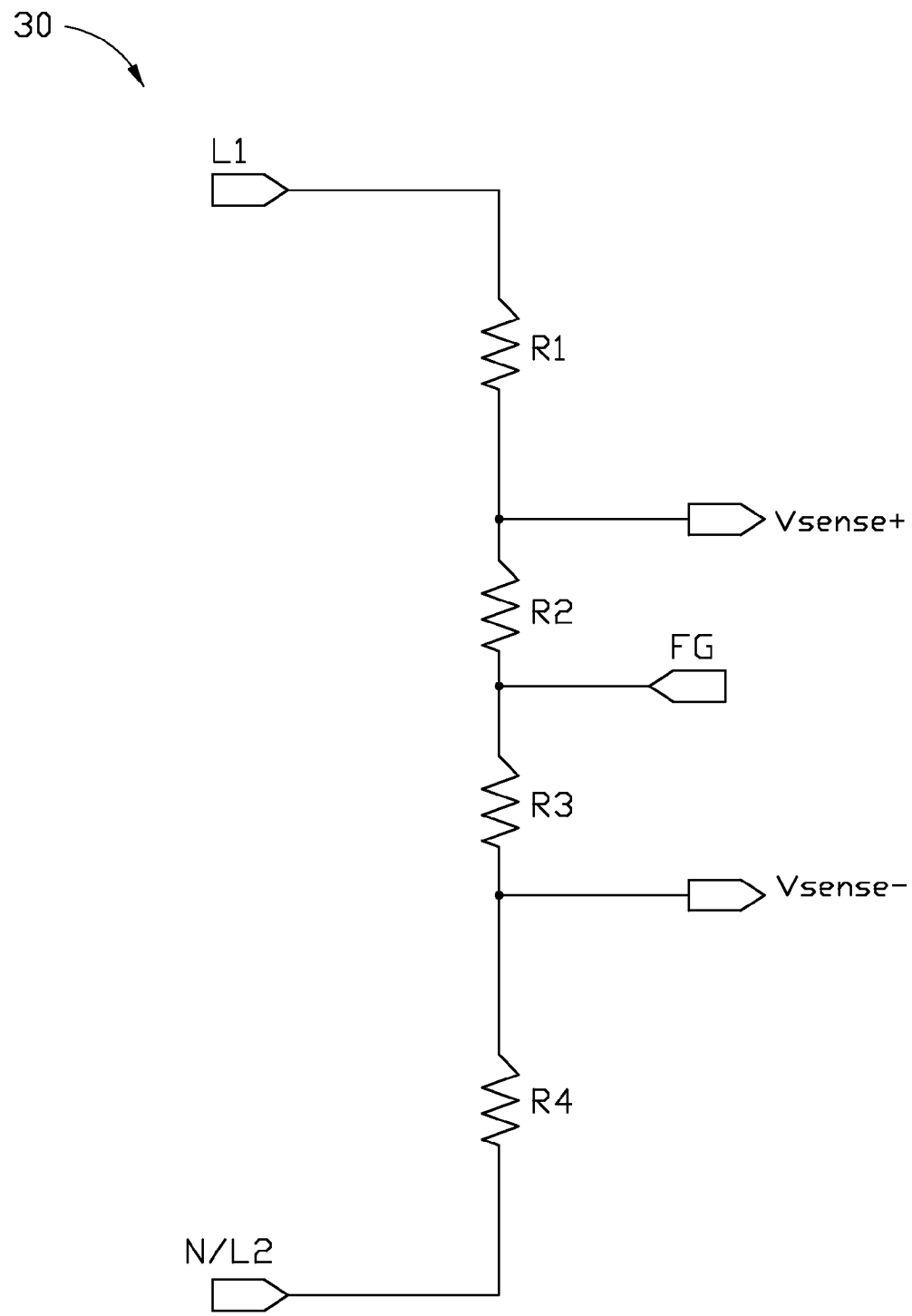
FIG. 2 is a circuit diagram of the voltage dividing circuit of FIG. 1.

Referring to FIG. 2, the voltage dividing circuit 30 includes four resistors R1-R4 connected between the first input terminal L1 and the second input terminal N/L2 in series. A ground node between the resistors R2 and R3 connects to the first power rectifying circuit 10 to receive the floating ground signal FG. A dividing node between the resistor R1 and the resistor R2 is used to output a first voltage dividing signal Vsense+, which is determined by the AC voltage signal from the first input terminal L1 and the resistances of the resistors R1 and R2. A dividing node between the resistor R3 and the resistor R4 is used to output a second voltage dividing signal Vsense−, which is determined by the AC voltage signal from the second input terminal N/L2 and the resistances of the resistors R3 and R4. In one embodiment, a ratio of impedance between the resistor R1 and the resistor R2 is equal to a ratio of impedance between the resistor R4 and the resistor R3.

The voltage dividing circuit 30 includes two dividing nodes to output the first and second voltage dividing signal Vsense+ and Vsense− respectively, and receives a floating ground signal FG between the resistors R2 and R3, therefore, the first input terminal L1 and the second input terminal N/L2 can be coupled with either the 110V or 220V single-phase two-wire-plus-ground (1Φ2W+G) systems, or the 220V single-phase three-wire electrical (1Φ3W) system. Even if swapping of the neutral pin with the hot pin of the AC wall outlet occurs, electrocution hazard for individuals and the measuring IC 40 is prevented.

The measuring IC 40 receives the first and second voltage dividing signals Vsense+ and Vsense− to obtain an AC voltage measuring signal. The measuring IC 40 transfers the AC voltage measuring signal to the MCU 62 through the photo coupling circuit 50. The MCU 62 processes the data of the AC voltage measuring signal and displays a measuring result on the display 70.

Furthermore, the measuring IC 40 and the control board 60 are powered by two individual power rectifying circuits 10 and 20, and electrically divided by the photo coupling circuit 50, which can effectively prevent electrical noise passing between the measuring IC 40 and the control board 60 and can increase measuring precision.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An alternating current (AC) power supply measuring circuit comprising:
   a first input terminal and a second input terminal, to receive an external AC voltage signal;
   a voltage dividing circuit to receive the AC voltage signal and divide the AC voltage signal to a first voltage dividing signal and a second voltage dividing signal, the voltage dividing circuit comprising first to fourth resistors connected between the first and second input terminals in series; a first dividing node between the first and second resistors outputting the first voltage dividing signal, a second dividing node between the third and fourth resistors outputting the second voltage dividing signal;
   a measuring integrated circuit (IC) to receive the first and second voltage dividing signals to obtain an AC voltage measuring signal;
   a control board to receive the AC voltage measuring signal and process the AC voltage measuring signal; and
   a first power rectifying circuit to provide a floating ground signal to the voltage dividing circuit, a ground node between the second and third resistors receiving the floating ground signal.

2. The measuring circuit of claim 1, further comprising a second power rectifying circuit, the first power rectifying circuit rectifying the AC voltage signal to a first direct current (DC) voltage signal to the measuring IC, the second power rectifying circuit rectifying the AC voltage signal to a second DC voltage signal to the control board.

3. The measuring circuit of claim 1, further comprising a photo coupling circuit, wherein the measuring IC transfers the AC voltage measuring signal to a micro control unit of the control board through the photo coupling circuit.

4. The measuring circuit of claim 1, wherein a ratio of impedance between the first resistor and the second resistor is equal to a ratio of impedance between the fourth resistor and the third resistor.

* * * * *